(12) United States Patent
Wilcox

(10) Patent No.: US 11,676,341 B2
(45) Date of Patent: Jun. 13, 2023

(54) COMPUTER IMPLEMENTED METHODS FOR GENERATING 3D GARMENT MODELS

(71) Applicant: Clothing Tech LLC, Austin, TX (US)

(72) Inventor: William Wilcox, Austin, TX (US)

(73) Assignee: CLOTHING TECH LLC, Austin, TX (US)

( * ) Notice: Subject to any disclaimer, the term of this patent is extended or adjusted under 35 U.S.C. 154(b) by 287 days.

(21) Appl. No.: 16/863,773

(22) Filed: Apr. 30, 2020

(65) Prior Publication Data

US 2021/0343083 A1 Nov. 4, 2021

(51) Int. Cl.

| | |
|---|---|
| *G06F 3/01* | (2006.01) |
| *G06T 19/00* | (2011.01) |
| *G06N 20/00* | (2019.01) |
| *G06F 30/10* | (2020.01) |
| *A41H 1/00* | (2006.01) |
| *G06N 5/04* | (2023.01) |
| *G06Q 10/10* | (2023.01) |
| *G06Q 30/0203* | (2023.01) |
| *G06Q 30/0601* | (2023.01) |

(52) U.S. Cl.
CPC .............. *G06T 19/00* (2013.01); *A41H 1/00* (2013.01); *G06F 30/10* (2020.01); *G06N 5/04* (2013.01); *G06N 20/00* (2019.01); *G06Q 10/10* (2013.01); *G06Q 30/0203* (2013.01); *G06Q 30/0643* (2013.01)

(58) Field of Classification Search
CPC combination set(s) only.
See application file for complete search history.

(56) References Cited

U.S. PATENT DOCUMENTS

| | | | | |
|---|---|---|---|---|
| 10,460,525 | B1* | 10/2019 | Buuck | G01F 17/00 |
| 10,664,903 | B1* | 5/2020 | Haitani | G06F 21/31 |
| 2017/0351323 | A1* | 12/2017 | Colaianni | G06F 3/0325 |
| 2018/0087196 | A1* | 3/2018 | Jeon | G06T 11/00 |
| 2019/0130649 | A1* | 5/2019 | O'Brien | G06F 30/00 |
| 2020/0090402 | A1* | 3/2020 | Su | A41H 1/00 |
| 2020/0126316 | A1* | 4/2020 | Sharma | G06T 17/20 |
| 2020/0380333 | A1* | 12/2020 | Sareen | G06N 3/006 |
| 2021/0217237 | A1* | 7/2021 | Lee | G06T 11/203 |

FOREIGN PATENT DOCUMENTS

| | | |
|---|---|---|
| WO | 2002057964 A2 | 7/2002 |
| WO | 2018182938 A1 | 4/2018 |

OTHER PUBLICATIONS

Extended European Search Report on European Patent Application No. EP 21 17 0715, dated Oct. 9, 2021.

* cited by examiner

*Primary Examiner* — Hilina K Demeter
(74) *Attorney, Agent, or Firm* — David A. Jones; Alpine IP

(57) ABSTRACT

The invention relates to a first computer implemented method for automatically generating a first 3D garment model representing a first garment to be fabricated from first garment panels, a second computer implemented method for virtually finishing a second 3D garment model representing a second garment to be fabricated without finishes or with default finishes, and a third computer implemented method for automatically generating a plurality of third 3D garment models in a batch process, each third 3D garment model representing a third garment to be fabricated from third garment panels.

5 Claims, 2 Drawing Sheets

COMPUTER IMPLEMENTED METHODS FOR GENERATING 3D GARMENT MODELS

FIELD OF THE INVENTION

The present invention relates to a computer implemented methods for generating 3D garment models. Specifically, a first method is disclosed for automatically generating a first 3D garment model representing a first garment to be fabricated from first garment panels, a second method is disclosed for virtually finishing a second 3D garment model representing a second garment to be fabricated without finishes or with default finishes, and a third method is disclosed for automatically generating a plurality of third 3D garment models in a batch process, each third 3D garment model representing a third garment to be fabricated from third garment panels.

BACKGROUND OF THE INVENTION

In the garment industry, it is a common process to import a garment pattern, i.e. a collection of 2D drawings of the panels of the garment, into a Computer Aided Design (CAD) program on a computer in order to manually assemble the garment with a computer mouse. Each piece is dragged over an avatar and rotated and moved into roughly its correct pose on the avatar, which can be done in 3D or in a 2D projection of the avatar. After the pieces are roughly orientated and placed around the avatar, the edges where the single panels are to be connected need to be selected manually. These process steps are very tedious and take a long time.

It is also the current state of the art that the technical definition of a garment is specified in two or more documents. One document is the garment pattern as mentioned above (often a 2D CAD model in DXF format) containing the pattern shapes and used for cutting out the different garment panels from cloth that are then assembled into a garment. Another document is a file or a set of files that contain assembly instructions and other details in a human readable format such as an Excel spread sheet or a PDF file. These kind of documents defining the garment are often referred to as a "Tech Pack". The human readable instructions usually contain information about which fabric to use, what colors, what thread and stitch types, what finishes, what trims (buttons, zippers, hooks, etc.) to process, and so on. Also size measurements in a chart for the different sizes of garments to be produced may be comprised by the "Tech Pack". Contrary to the garment pattern, which depending on its file format (and whether it is digitally available at all), said assembly instructions are indeed not machine-readable because they address the human reader.

The state of the garment industry today is further that there are millions of "Tech Packs" (garment patterns and assembly instructions) but very few corresponding 3D virtual garments, which are sometimes also referred to as "Garment Digital Twins" (GDT). This is because the conversion is manual and tedious to convert from what the industry has (patterns and tech packs) into 3D models. GDT is synonymously used herein for 3D garment model.

In general, there is a desire in the industry to provide garment designers with three-dimensional models of garments so that they can check or validate the design of the garment. The garment design is a very tedious process with many iterative steps usually starting with perspective sketches and subsequent estimations of 2D pattern shapes based on experience and knowledge. A first sample is manufactured which is inspected by the designer who then corrects the garment patterns again based on his experience. A second sample verifies the changes and the process can continue like this until a garment is manufactured that meets the designers expectations.

Furthermore, garment designers may want to update a garment design by amending an existing GDT on a three-dimensional virtual graphical user interface. It is therefore desirable to not start the design process from zero, but to have a predecessor model, e.g. a pre-season design, as a basis.

3D "Garment Digital Twins" are further of an increasing interest for the industry as they can be used to illustrate the garment, e.g. on a website, without the need for expensive and elaborate photo shootings. Once a GDT is at hand, it can be displayed in different poses, colors, sizes, and worn by different avatars or hangers. As well, the GDTs can be illustrated in a virtual fitting room where a customer can provide a three-dimensional representation of himself and virtually "try on" several different garments in different styles and sizes.

OBJECT OF THE INVENTION

Therefore, the invention provides computer implemented methods that help overcoming this vast backlog demand. Methods according to the invention allow for reductions of working time and man power.

SUMMARY OF THE INVENTION

The invention relates to a first computer implemented method, with program code being stored on a machine readable medium or embodied as an electromagnetic wave, for automatically generating a first 3D garment model representing a first garment to be fabricated from first garment panels, the computer implemented method comprising: (a) providing one or more first documents comprising a plurality of first 2D pattern pieces representing the first garment panels, (b) determining with a pattern recognition algorithm (i) a garment type indicator for at least one of the first 2D pattern pieces, the garment type indicator representing a type of a garment that the respective first garment panel belongs to and being one of a plurality of garment type indicators stored on the machine readable medium, and (ii) a panel pose indicator for each of the first 2D pattern pieces, the panel pose indicator representing an estimated position and an estimated orientation of the respective garment panel within the first garment, and (c) generating the first 3D garment model based on the first 2D pattern pieces, the at least one garment type indicator, and the panel pose indicators.

In an embodiment, the first computer implemented method further comprises adding default finishes to the first 3D garment model based on at least one of the at least one garment type indicator and the panel pose indicators.

In an embodiment, the first computer implemented method further comprises generating a first 2D panel model for each of the first 2D pattern pieces, wherein generating the first 3D garment model is based on draping a reference object with the first 2D panel models.

In an embodiment, the first computer implemented method further comprises: (a) positioning and orienting the first 2D panel models based on the panel pose indicators, in particular further based on a proportion of the 2D pattern pieces relative to each other, (b) while, before, or after positioning and orienting the 2D panel models, shaping each of the first 2D panel models into first 3D panel models so as they adapt to a shape of the reference object based on the at least one garment type indicator, and the panel pose indicators, and (c) generating the first 3D garment model by virtually assembling the first 3D panel models along their respective edges.

In an embodiment of the first computer implemented method, for determining a garment type indicator and the panel pose indicator, the pattern recognition algorithm is configured for analyzing at least one of (a) a shape of the 2D pattern piece, (b) a proportion of the 2D pattern piece relative to the other 2D pattern pieces, (c) textual information associated with the 2D pattern piece in the respective first document, (d) whether the 2D pattern piece is at least in part symmetrical or not, and (e) an amount of provided 2D pattern pieces.

The invention further relates to a second computer implemented method, with program code being stored on a machine readable medium or embodied as an electromagnetic wave, for virtually finishing a second 3D garment model representing a second garment to be fabricated without finishes or with default finishes, the computer implemented method comprising: (a) providing the second 3D garment model, (b) providing one or more second documents comprising human-readable garment finishing instructions for finishing the second garment, (c) determining with an extraction algorithm at least one garment finish feature from the one or more second documents, the garment finish feature corresponding to an additional garment component or a garment property and being indicative for a position and an orientation of the respective additional garment component or garment property within the second garment, and (d) virtually finishing the second 3D garment model based on the determined at least one garment finish feature.

In an embodiment of the second computer implemented method, virtually finishing the second 3D garment model comprises modifying at least a part of the second 3D garment model.

In an embodiment of the second computer implemented method, the garment finish feature corresponds to a fabric type of at least part of the second 3D garment model, wherein modifying the at least a part of the second 3D garment model comprises attributing at least one of a texture and a color to at least part of the second 3D garment model based on the garment finish feature.

In an embodiment of the second computer implemented method, the garment finish feature corresponds to seams of the second garment, wherein modifying at least a part of the second 3D garment model comprises attributing at least one of a thread color, a thread type, and a stitch pattern to seams of the second garment.

In an embodiment of the second computer implemented method, virtually finishing the second 3D garment model comprises adding at least one garment finish model to the second 3D garment model.

In an embodiment of the second computer implemented method, the garment finish feature corresponds to seams of the second garment, wherein the at least one garment finish model represents stitches to be placed at dedicated locations within the second garment.

In an embodiment of the second computer implemented method, the garment finish feature corresponds to bindings of the second garment, wherein the at least one garment finish model represents hems to be placed at openings of the second garment.

In an embodiment of the second computer implemented method, the garment finish feature corresponds to a closure of the garment, wherein the at least one garment finish model represents at least one of a button, a buttonhook, a snap fastener, a zipper, a touch fastener, a magnetic fastener, a hook, a loop for a hook or a button, a cord fastener, and laces.

In an embodiment of the second computer implemented method, for determining the at least one garment finish feature, the extraction algorithm is configured for analyzing the one or more second documents with respect to at least one of: textual information, image data, arrows, size data, color swatches, color indicators, stitch types, and stitch designations.

The invention further relates to a third computer implemented method, with program code being stored on a machine readable medium or embodied as an electromagnetic wave, for automatically generating a plurality of third 3D garment models in a batch process, each third 3D garment model representing a third garment to be fabricated from third garment panels, the computer implemented method comprising: (a) for each third 3D garment model to be generated: (i) providing one or more third documents comprising (i1) a plurality of third 2D pattern pieces representing the third garment panels and (i2) human-readable garment finishing instructions for finishing the third garment, (ii) recognizing patterns of the third 2D pattern pieces, (iii) generating a fourth 3D garment model based on the recognized patterns of third 2D pattern pieces, (iv) extracting at least one garment finish feature from the human-readable garment finishing instructions, (v) generating a third 3D garment model by virtually finishing each of the fourth 3D garment models based on the extracted at least one garment finish feature; and (b) for the batch-processed plurality of third 3D garment models, generating a report comprising statistics about at least one of: (i) whether a fourth 3D garment model could be generated for each of the third 3D garment models to be generated, (ii) which of the fourth 3D garment models could be generated, (iii) for each of the fourth 3D garment models that could be generated, a level of confidence that it was generated correctly, (iv) which of the fourth 3D garment models could not be generated, (v) which of the fourth 3D garment models could be generated only in part and to what extent, (vi) whether a third 3D garment model could be generated from each of the fourth 3D garment models, (vii) which of the third 3D garment models could be generated, (viii) for each of the third 3D garment models that could be generated, a level of confidence that it was generated correctly, (ix) which of the third 3D garment models could not be generated, and (x) which of the third 3D garment model could be generated only in part and to what extent.

In an embodiment of the third computer implemented method, recognizing patterns of the third 2D pattern pieces is based on determining with a pattern recognition algorithm (a) a garment type indicator for at least one of the third 2D pattern pieces, the garment type indicator representing a type of a garment that the respective third garment panel belongs to and being one of a plurality of garment type indicators stored on the machine readable medium, and (b) a panel pose indicator for each of the third 2D pattern pieces, the panel pose indicator representing an estimated position and an estimated orientation of the respective garment panel within the third garment, wherein generating the fourth 3D garment model is further based on the garment type indicator and the panel pose indicator.

In an embodiment of the third computer implemented method, the pattern recognition algorithm is trainable based on at least one of the generated report and user feedback.

In an embodiment of the third computer implemented method, extracting at least one garment finish feature is based on determining with an extraction algorithm the at least one garment finish feature from the one or more third documents, the garment finish feature corresponding to an additional garment component or a garment property and being indicative for a position and an orientation of the respective additional garment component or garment property within the third garment.

In an embodiment of the third computer implemented method, for determining the at least one garment finish feature, the extraction algorithm is configured for analyzing the one or more third documents with respect to at least one of: textual information, image data, arrows, size data, color swatches, color indicators, stitch types, and stitch designations.

In an embodiment of the third computer implemented method, the extraction algorithm is trainable based on at least one of the generated report and user feedback.

In other words, certain embodiments of the first, second, and third methods may be circumscribed as follows:

The first method starts by characterizing the pattern pieces, which means that it is identified 1) what the piece is, 2) where it goes on the human body (avatar) and at what rotation. Knowing what the piece is and where it goes on the avatar simplifies the next step which is to automatically assemble the garment. There are many fewer potential assembly scenarios when it is known what pieces are near what other pieces. The first method could be considered describing a trained expert system that is used to characterize the pieces. However, it is also possible to make use of an algorithmic approach that uses information such as the text on the piece, the shape of the piece, the size, whether it is symmetrical, the number of discrete segments, etc. In any case, the different shapes that belong to a garment are recognized, it is determined what each pattern piece is, and where it is located on the body. From this, the assembly of the garment into a 3D shape is automated. This 3D model may then be used to extend or amend the design with help of a Graphical User Interface (GUI).

The second method allows to look for relevant text in a document describing garment assembly instructions, e.g. a PDF, the relevant text relating to garment finishes (stitches, hems, neckline, waist, closures etc.). This information is extracted and related to a 3D garment digital twin that so far does not have finishes or only default finishes. This means that for example an Excel spreadsheet or PDF is searched for key information which are then extracted automatically and applied to the 3D digital version of the garment in the form of a garment opening (neck, sleeve, waist etc.), the colors of the garment to produce for the different pieces, the fabric type, the trims etc. Further, images, arrows, size tables, color swatches or indicators, stitch types or designations may be extracted and be converted into garment components and/or properties that can be applied to the 2D panels and/or the 3D model to produce a virtual finished garment.

The third method realizes an automated "Garment Digital Twin" (GDT) creation from a list of patterns (e.g. DXF file) and a corresponding "Tech Pack" (e.g. PDF files describing the garment in human readable form) for each of the single patterns. The GDTs are automatically created in a batch mode indicating the success or failure of each conversion. The batch processing mode comprises reading a series of documents that may be organized by garment style. Each set of documents that define a garment is read in and then converted to a 3D digital twin without the need for any user interaction. At the end, the user is provided with a report of all the garments converted and a status if the garment converted successfully and the confidence level that a correct conversion has been performed. This will allow businesses active in the garment industry to convert huge amounts of garments overnight and then edit or correct the areas where the garment conversion did not succeed.

BRIEF DESCRIPTION OF THE DRAWINGS

By way of example only, preferred embodiments of the invention will be described more fully hereinafter with reference to the accompanying figures, wherein.

DETAILED DESCRIPTION OF THE DRAWINGS

Figure 1:
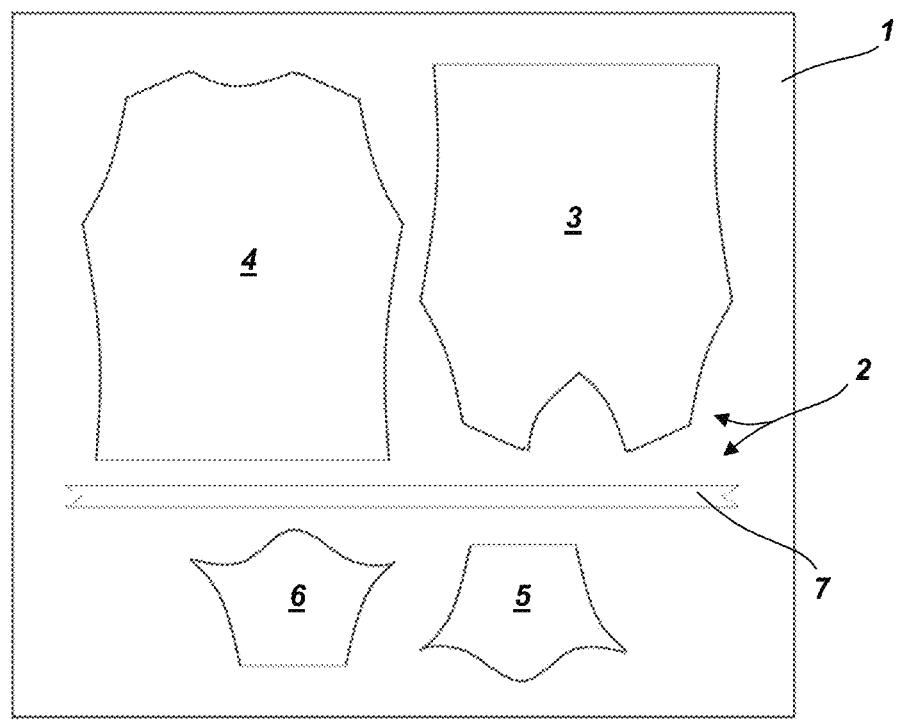
FIG. 1 shows an exemplary first document or at least a part of a third document.
Figure 2:
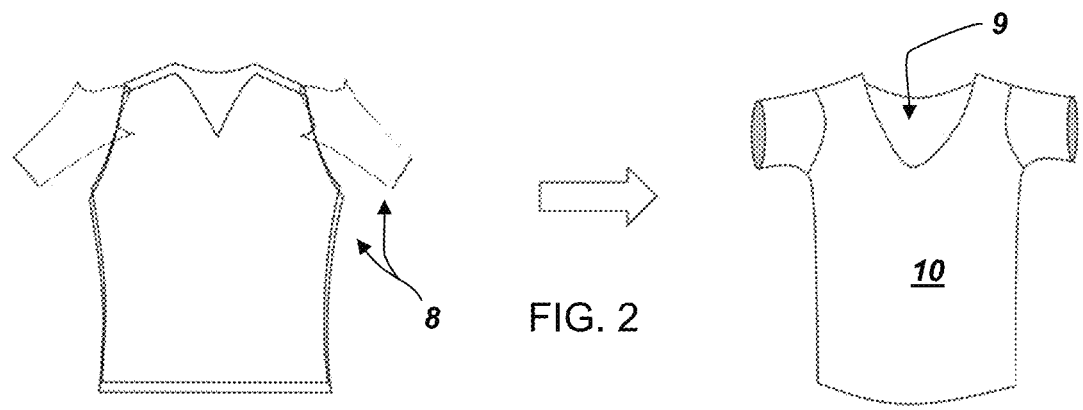
FIG. 2 shows an embodiment of preliminarily orienting and positioning 2D panel models on their dedicated poses within an avatar as a preparation for the virtual garment assembly.
Figure 3:
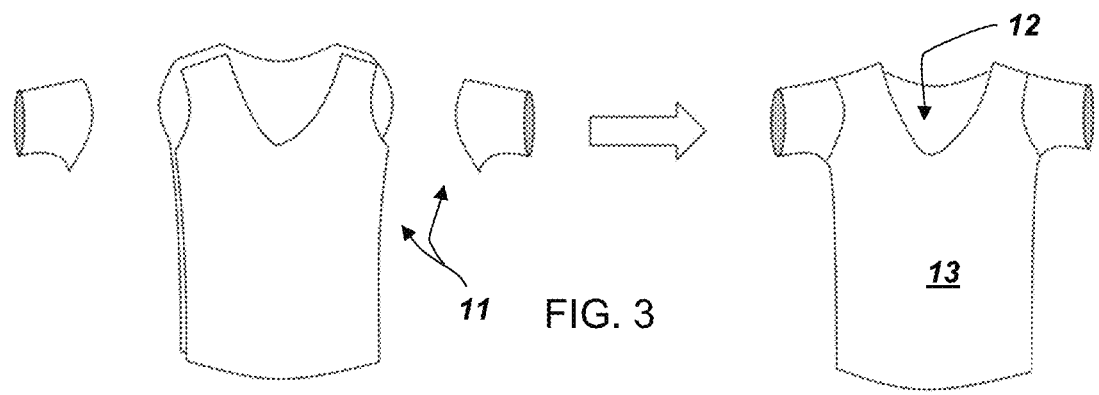
FIG. 3 shows an embodiment of pre-shaping 2D panel models into 3D panel models as a preparation for the virtual garment assembly.

FIGS. 1 to 3 show aspects that are used in the first computer implemented method as presented herein. The purpose of this method is to automatically generate a first 3D garment model such that it represents a first garment that is to be fabricated in reality from first garment panels.

With the first method it is therefore proposed to provide one or more first documents 1 which comprise a plurality of first 2D pattern pieces 2 that represent those the first garment panels. These documents could be a Computer Aided Design (CAD) file, a Portable Document Format (PDF) file, an image file in any format, or any other file containing computer-readable or human-readable 2D shapes of pattern pieces. In the shown example, the 2D pattern document 1 contains representations of the front and back panels of a T-shirt (3 and 4), the sleeve panels 5 and 6, and a neck binding (or neck tape) 7.

According to the invention, a garment type indicator for at least one of the first 2D pattern pieces 2 is determined with a pattern recognition algorithm. The garment type indicator represents a type of a garment that the respective first garment panel(s) belong(s) to. In this case, the pattern recognition algorithm detects that this document 1 belongs to a T-shirt because a typically shaped panel and/or a typical collection of typically shaped panels was detected.

The determined garment type indicator is one of a plurality of garment type indicators stored on the machine readable medium. For example, the garment type indicators can refer to the type of garment on a very basic level, like a T-shirt, pants, underwear, etc., but it can alternatively or additionally also refer to the type of garment on a more detailed level, like long-sleeved shirt or short-sleeved shirt, ladieswear or menswear, dressed or denim, suit pants or 5-pocket, etc.

Furthermore, a panel pose indicator is determined with the pattern recognition algorithm for each of the first 2D pattern pieces. The panel pose indicator represents an estimated position and an estimated orientation of the respective garment panel within the first garment. For example, the algorithm will identify a panel with the shape of the back piece 4 to be located in the back with the long straight line at the bottom. It will further identify the front piece 3 to be located in the front but turned around such that again the long straight line is at the bottom and the neck part in the top. The first 3D garment model is now generated based on the first 2D pattern pieces, the at least one garment type indicator, and the panel pose indicators.

FIGS. 2 and 3 show two examples of this positioning and orienting. These two ways of assembly can be complementing or be applied alternatively.

According to what is shown in FIG. 2, the first method may further comprise the generation of a first 2D panel model 8 for each of the first 2D pattern pieces 2, which are positioned and oriented in accordance with the panel pose indicators, wherein for generating the first 3D garment model 10, a reference object 9 is draped with the first 2D panel models 8. In the shown example, the reference object 9 is an invisible or transparent avatar having an average shape of a human body, in particular in accordance with the garment type indicator (woman/man/child, etc.).

According to what is shown in FIG. 3, the single components for the first 3D garment model 12 may be represented by first 2D panel models which are then pre-shaped before the final assembly to form first 3D panel models 11. As shown, each sleeve is wrapped around, e.g. to form a tube as shown, and sewed together, and the front and back panel are shaped following a typical chest and back form. In this way, assembling these first 3D panel models 11 to form a first 3D garment model 13 is straightforward because fewer computational effort is necessary to find the lines of connection (seams).

The first 3D garment model 13 is shown on a transparent avatar 12, but the reference object can also be a garment hanger or any other holder that presents the garment in such a way that a designer can easily work on the garment design in a CAD environment. The reference object can be two- or three-dimensional.

In summary, the first method may further comprise said positioning and orienting of the first 2D panel models 8 based on the panel pose indicators, in particular further based on based on a proportion of the first 2D pattern pieces 2 relative to each other. If also said proportion is taken into account, then the panels can be positioned and oriented already quite closely to each other (because the general size of the garment can be estimated) such that the rendering of the assembly is made more efficient.

While, before, or after said positioning and orienting the 2D panel models 8, the first method may include shaping each of the first 2D panel models 8 into first 3D panel models 11 so as they adapt to a shape of the reference object 13 (in the respective area) based on the at least one garment type indicator, and the panel pose indicators. Thus, according to a respective garment type indicator (in this case: a T-shirt), the first method may take into account information (which may be stored on the computer-readable medium) about the typical 3D shape of the respective panel.

Eventually, the first 3D garment model 13 is generated by virtually assembling the first 3D panel models 11 (which are the shaped first 2D panel models 8) along their respective edges. In particular, the first 2D or 3D panel models are virtually stitched together a default allowance away from the edges, wherein models of default seams can be provided at the virtual stitch lines.

In general, the first method may provide adding default finishes to the first 3D garment model based on the respective garment type indicator and/or the panel pose indicators. For example, in the awareness that the present garment is a T-shirt, the first 3D garment model 10/13 might be equipped with standard French seams, wherein in case of a jeans the method might equip the first 3D garment model with a standard lapped seam.

In an embodiment of the first computer implemented method, for determining a garment type indicator and the panel pose indicator, the pattern recognition algorithm is configured for analyzing at least one of (a) a shape of the 2D pattern piece, (b) a proportion of the 2D pattern piece relative to the other 2D pattern pieces, (c) textual information associated with the 2D pattern piece in the respective first document, (d) whether the 2D pattern piece is at least in part symmetrical or not, and (e) an amount of provided 2D pattern pieces.

A particular advantage of said first method is that the first 3D garment model is fully automatically generated without the need of manual intervention, based on merely the at least one first document with its depiction or description of the first 2D pattern pieces that represent the first garment panels from which the first garment is to be fabricated.

The first method, in particular the pattern recognition algorithm, may be trainable based on machine learning using training data from previous first 3D garment model generations. Specifically, such a machine learning algorithm can "learn" from user input that is aimed at correcting the automatic choices made by the computer.

Figure 4:
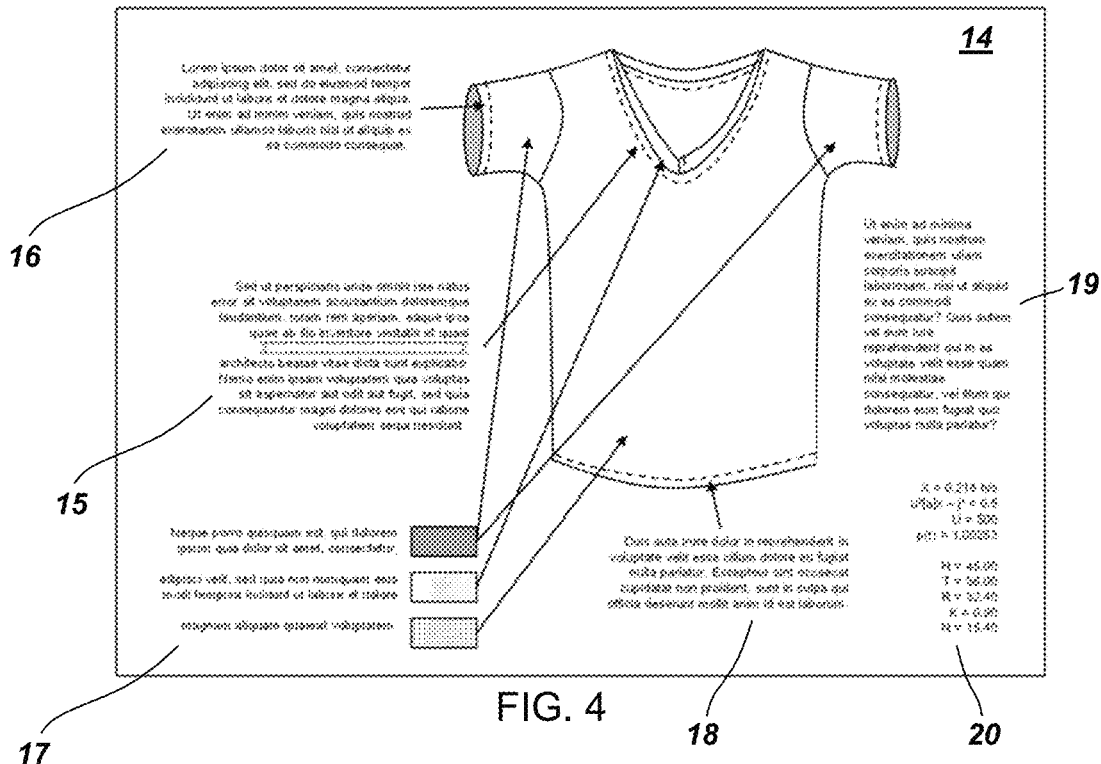
FIG. 4 shows an exemplary second document or at least a part of a third document.
Figure 5:
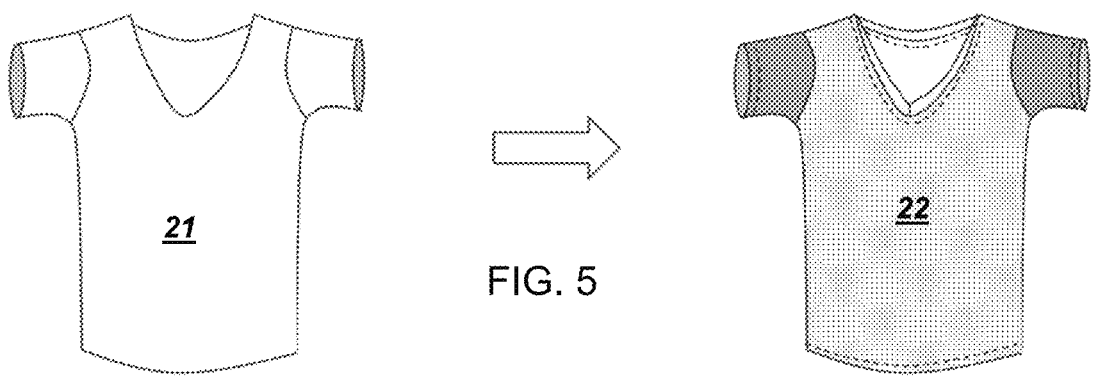
FIG. 5 shows an embodiment of finishing a 3D garment model that has no finishes yet based at least in part on the document as shown in FIG. 4.

FIGS. 4 and 5 show aspects that are used in the second computer implemented method as presented herein. The purpose of this method is to virtually finish a second 3D garment model which represents a second garment to be fabricated in reality and which does not yet have finishes or merely has default finishes.

With the second method it is therefore proposed to provide said second 3D garment model that has no or only default finishes and to further provide one or more second documents which comprise human-readable garment finishing instructions for finishing the second garment. One exemplary such document 14, often referred to as "Tech Pack" among experts, is shown in FIG. 4. These one or more second documents describe how a certain garment is to be finished. As such, the document may refer to several garment finish features, such as the type of fabric to be used, the color to be chosen for a specific component, the stitch type and a hem type to fabricate at an opening, the addition of certain elements, as well as further parameters and description that instruct a sewer to finish the garment. The instructions in such documents address humans and not machines. In the shown example of FIG. 4, the single garment finish features are pointed at with arrows and described with text, parameters, references to 2D patterns, and/or samples.

The second method provides an extraction algorithm that is configured to determine at least one such garment finish feature from the one or more second documents. Said garment finish feature corresponds to an additional garment component and/or a garment property, and is indicative for a position and an orientation of the respective additional garment component or garment property within the second garment. Therefore, the extraction algorithm specifically extracts all the information necessary to finish the garment as is provisioned in the second document(s). In particular, the extraction algorithm is configured to interpret the human-readable instructions and illustrations to establish the garment finish features.

The second 3D garment model is then virtually finished based on the determined at least one garment finish feature. Specifically, the second method may retrieve stored elements (e.g. 3D models of zippers or 2D models of seams) and/or model appearances (texture, color, etc.) in order to modify the second 3D garment model 21 (see FIG. 5) to form a finished second 3D garment model 22. In particular, the second method provides interpretations of garment finish features based on training data as to how and where the second 3D garment model 21 is to be modified in order to arrive at the finished second 3D garment model 22. Thus, when the garment finish feature corresponds to a fabric type 17 of at least part of the second 3D garment model, the at least part of the second 3D garment model is modified by attributing at least one of a texture and a color to at least part of the second 3D garment model based on the garment finish feature.

If the garment finish feature corresponds to seams of the second garment (see for example reference 18), the at least part of the second 3D garment model is modified by attributing at least one of a thread color, a thread type, and a stitch pattern to seams of the second garment.

Virtually finishing the second 3D garment model 21 may as mentioned also comprise adding at least one garment finish model to the second 3D garment model. For example, as shown in FIG. 4, the V-neckline is hemmed with an added neck tape (see reference 7 in FIG. 1) referred to in the text 15 pointing at the neckline. In other embodiments, the neckline may be a boundary for further shaping the upper edge of the garment with a collar, cowl, darts, or pleats.

If the garment finish feature corresponds to seams of the second garment, the at least one garment finish model may represent stitches to be placed at dedicated locations within the second garment, see reference 15, 16, and 18 in FIG. 4. If the garment finish feature corresponds to bindings of the second garment (see reference 18), the at least one garment finish model may represent a hem to be placed at the lower opening of the second garment. Therefore, in the given example of FIG. 5, the bottom edge of the second 3D garment model 21 is turned down (or just shortened for the sake of visualization) and virtually stitched.

In an embodiment of the second computer implemented method, the garment finish feature may also correspond to a closure of the garment (not the case in the shown example), wherein the at least one garment finish model represents at least one of a button, a buttonhook, a snap fastener, a zipper, a touch fastener, a magnetic fastener, a hook, a loop for a hook or a button, a cord fastener, and laces.

Specifically, for determining the at least one garment finish feature, the extraction algorithm may be configured for analyzing the one or more second document 14 with respect to at least one of: textual information 15-19, image data, arrows, size data 20, color swatches 17, color indicators, stitch types, and stitch designations. The algorithm may be trained to search the second document(s) 14 for keywords, known patterns in describing a garment finish feature, arrows (especially the alignment of arrows), numeric values (especially typical number ranges), and so on.

Specifically, the second 3D garment model 21 may be an assembly of a plurality of second 3D pattern pieces representing second garment panels that the second garment is to be fabricated from, i.e. just as it is established as first 3D garment model by the first method described above. This first 3D garment model lacks finishes or is equipped with default finishes because it is based on the first 2D pattern pieces comprised by the first document which is usually silent about how the panels are to be assembled.

In a special embodiment, the third method as presented herein is a combination of the first and second method. However, more generally speaking, the purpose of the third method is to automatically generate a plurality of third 3D garment models in a batch process, each third 3D garment model representing a third garment to be fabricated from third garment panels. According to the third method, for each third 3D garment model to be generated, one or more third documents are provided. Said third document(s) comprise(s) a plurality of third 2D pattern pieces representing the third garment panels and human-readable garment finishing instructions for finishing the third garment. Hence, just as for the assembly process in reality, the garment patterns and corresponding instructions ("Tech Pack") are provided.

The patterns of the third 2D pattern pieces are then automatically recognized, based on which a fourth 3D garment model is generated. From the human-readable garment finishing instructions, at least one garment finish feature is extracted, based on which third 3D garment model is generated by virtually finishing each of the fourth 3D garment models. Even if the nomenclature suggests otherwise, the fourth 3D garment model is a "work-in-progress" and is predecessor to the third 3D garment model.

After a plurality of third 3D garment models have been batch-processed, a report is generated which is indicative for at least one of: (i) could all third documents be translated into fourth 3D garment models? (ii) specifically which of the fourth 3D garment models could be generated? (iii) with what level of confidence (likelihood of correctness) was each of the fourth 3D garment models generated? (iv) specifically which of the fourth 3D garment models could not be generated? (v) which of the fourth 3D garment models could be generated only in part and to what extent (e.g. what part is missing)? (vi) could a third 3D garment model be generated from each of the fourth 3D garment models? (vii) which of the third 3D garment models could be generated? (viii) with what level of confidence (likelihood of correctness) was each of the third 3D garment models generated? (ix) which of the third 3D garment models could not be generated? and (x) which of the third 3D garment model could be generated only in part and to what extent (what part or feature is missing)?

The report may be used by a user to quickly find out about the unsuccessful or partly successful conversions in order to manually correct the respective models or give feedback to the computer (e.g. by confirming or rejecting the respective part of the report). The report and/or the manual corrections/user feedback may be used to further improve or train the pattern recognition, the extraction, and/or the virtual panel assembly.

Specifically, recognizing the patterns of the third 2D pattern pieces may be based on determining, with a pattern recognition algorithm, a garment type indicator for at least one of the third 2D pattern pieces and a panel pose indicator for each of the third 2D pattern pieces. Generating the fourth 3D garment model is further based on the garment type indicator and the panel pose indicator.

Said garment type indicator represents, or in other words: is indicative for, a type of a garment that the respective third garment panel belongs to. The garment type indicator may be selected from a plurality of garment type indicators stored on the machine readable medium. Said panel pose indicator representing, or in other words: is indicative for, an estimated or preliminary position and an estimated or preliminary orientation of the respective garment panel within the third garment.

Furthermore, the extraction of the at least one garment finish feature may be based on determining, with an extraction algorithm, the at least one garment finish feature from the one or more third documents, in particular from the human-readable garment finishing instructions for finishing the third garment. The garment finish feature corresponds to an additional garment component or a garment property and represents, or in other words: is indicative for, a position and an orientation of (a) the respective additional garment component or (b) the respective garment property within the third garment.

For determining the at least one garment finish feature, the extraction algorithm may be configured for analyzing the one or more third documents, in particular the human-readable garment finishing instructions for finishing the third garment, with respect to at least one of: textual information, image data, arrows, size data, color swatches, color indicators, stitch types, and stitch designations.

The one or more third documents that correspond to a single garment (for which the third 3D garment model is to be generated) may in particular be so-called "Tech Packs" with corresponding 2D patterns and assembly instructions. This could all be combined in one file or document, however, it may also be provided as two or more correlated files or documents.

It is noted that the text in FIG. 4 is dummy text (lorem ipsum) the only purpose of which is to indicate that in such a document there may be several text passages for assembly guidance and similar comments addressed to the human user, i.e. non machine-readable. FIG. 4 shows an example for at least a part of a second document and for at least a part of a third document.

Although the invention is illustrated above, partly with reference to some preferred embodiments, it must be understood that numerous modifications and combinations of different features of the embodiments can be made. All of these modifications lie within the scope of the appended claims.

The invention claimed is:

1. A computer implemented method, with program code being stored on a machine readable medium for automatically generating a plurality of first 3D garment models in a batch process, each first 3D garment model representing a first garment to be fabricated from garment panels, the computer implemented method comprising: for each first 3D garment model to be generated:
providing one or more first documents comprising: a plurality of first 2D pattern pieces representing the garment panels; and
human-readable garment finishing instructions for finishing the first garment; recognizing patterns of the first 2D pattern pieces;
generating a second 3D garment model based on the recognized patterns of first 2D pattern pieces; extracting at least one garment finish feature from the human-readable garment finishing instructions;
generating a first 3D garment model by virtually finishing each of the second 3D garment models based on the extracted at least one garment finish feature; and
for the batch-processed plurality of first 3D garment models, generating a report comprising statistics about at least one of:
whether a second 3D garment model could be generated for each of the first 3D garment models to be generated, which of the second 3D garment models could be generated, for each of the second 3D garment models that could be generated, a level of confidence that it was generated correctly,
which of the second 3D garment models could not be generated, which of the second 3D garment models could be generated only in part and to what extent,
whether a first 3D garment model could be generated from each of the second 3D garment models, which of the first 3D garment models could be generated,
for each of the first 3D garment models that could be generated, a level of confidence that it was generated correctly, which of the first 3D garment models could not be generated, and which of the first 3D garment model could be generated only in part and to what extent; and
wherein extracting at least one garment finish feature is based on determining with an extraction algorithm the at least one garment finish feature from the one or more first documents, the garment finish feature corresponding to an additional garment component or a garment property and being indicative for a position and an orientation of the respective additional garment component or garment property within the first garment.

2. The computer implemented method according to claim 1, wherein recognizing patterns of the first 2D pattern pieces is based on determining with a pattern recognition algorithm:
a garment type indicator for at least one of the first 2D pattern pieces, the garment type indicator representing a type of a garment that the respective third garment panel belongs to and being one of a plurality of garment type indicators stored on the machine readable medium, and
a panel pose indicator for each of the first 2D pattern pieces, the panel pose indicator representing an estimated position and an estimated orientation of the respective garment panel within the first garment,
wherein generating the second 3D garment model is further based on the garment type indicator and the panel pose indicator.

3. The computer implemented method according to claim 2, wherein the pattern recognition algorithm is trainable based on at least one of the generated report and user feedback.

4. The computer implemented method according to claim 1, wherein for determining the at least one garment finish feature, the extraction algorithm is configured for analyzing the one or more first documents with respect to at least one of: textual information, image data, arrows, size data, color swatches, color indicators, stitch types, and stitch designations.

5. The computer implemented method according to claim 1, wherein the extraction algorithm is trainable based on at least one of the generated report and user feedback.

* * * * *